US00RE43663E

(19) United States
(12) Reissued Patent
Kawashima et al.

(10) Patent Number: US RE43,663 E
(45) Date of Reissued Patent: Sep. 18, 2012

(54) SEMICONDUCTOR DEVICE

(75) Inventors: Tetsuya Kawashima, Hitachi (JP); Akira Mishima, Mito (JP)

(73) Assignee: Renesas Electronics Corporation, Kanagawa (JP)

(21) Appl. No.: 12/821,999

(22) Filed: Jun. 23, 2010

Related U.S. Patent Documents

Reissue of:
(64) Patent No.: 7,145,224
Issued: Dec. 5, 2006
Appl. No.: 11/041,200
Filed: Jan. 25, 2005

(30) Foreign Application Priority Data

Jan. 28, 2004 (JP) ..... 2004-020474

(51) Int. Cl.
*H01L 23/02* (2006.01)
*H01L 23/12* (2006.01)

(52) U.S. Cl. ..... 257/678; 257/676; 257/690; 257/691; 257/700; 257/706; 257/707; 257/712; 257/713; 257/720; 257/722; 257/723

(58) Field of Classification Search ..... 257/678, 257/676, 690, 691, 723, 700, 706, 707, 712, 257/713, 720, 722, 730–733, E23.051, E23.08, 257/E23.101, E23.103, E31.131, E33.075
See application file for complete search history.

(56) References Cited

U.S. PATENT DOCUMENTS 6,693,350 B2 * 2/2004 Teshima et al. ..... 257/712
6,756,689 B2 * 6/2004 Nam et al. ..... 257/783
6,891,265 B2 * 5/2005 Mamitsu et al. ..... 257/718
6,917,103 B2 * 7/2005 Hirano et al. ..... 257/707
6,960,825 B2 * 11/2005 Mamitsu et al. ..... 257/718
6,963,133 B2 * 11/2005 Teshima ..... 257/718

(Continued)

FOREIGN PATENT DOCUMENTS

JP H6-2714 1/1994

(Continued)

OTHER PUBLICATIONS

Notice of Rejection: JP Pat. Appln. 2004-020474; mailed May 8, 2007; pp. 1-2.

(Continued)

*Primary Examiner* — Jasmine Clark
(74) *Attorney, Agent, or Firm* — Antonelli, Terry, Stout & Kraus, LLP.

(57) ABSTRACT

In the semiconductor device, a control power MOSFET chip 2 is disposed on the input-side plate-like lead 5, and the drain terminal DT1 is formed on the rear surface of the chip 2, and the source terminal ST1 and gate terminal GT1 are formed on the principal surface of the chip 2, and the source terminal ST1 is connected to the plate-like lead for source 12. Furthermore, a synchronous power MOSFET chip 3 is disposed on the output-side plate-like lead 6, and the drain terminal DT2 is formed on the rear surface of the chip 3 and the output-side plate-like lead 6 is connected to the drain terminal DT2. Furthermore, source terminal ST2 and gate terminal GT2 are formed on the principal surface of the synchronous power MOSFET chip 3, and the source terminal ST2 is connected to the plate-like lead for source 13. The plate-like leads for source 12 and 13 are exposed, and therefore, it is possible to increase the heat dissipation capability of the MCM 1.

24 Claims, 9 Drawing Sheets

U.S. PATENT DOCUMENTS

| | | | | |
|---|---|---|---|---|
| 7,071,550 | B2 * | 7/2006 | Sato | 257/706 |
| 7,449,777 | B2 * | 11/2008 | Deboy et al. | 257/723 |
| 2001/0033477 | A1 | 10/2001 | Inoue et al. | 257/718 |
| 2002/0195704 | A1 | 12/2002 | Chan et al. | 257/724 |
| 2003/0132530 | A1 | 7/2003 | Teshima et al. | 257/780 |

FOREIGN PATENT DOCUMENTS

| | | |
|---|---|---|
| JP | H6-291223 | 10/1994 |
| JP | 2001-308263 | 2/2001 |
| JP | 2001-291823 | 10/2001 |
| JP | 2001-320005 | 11/2001 |
| JP | 2001-352023 | 12/2001 |
| JP | 2002-26215 | 1/2002 |
| JP | 2002-083915 | 3/2002 |
| JP | 2002-110893 | 4/2002 |
| JP | 2003-046036 | 2/2003 |
| WO | WO 2004/008532 | 1/2004 |

OTHER PUBLICATIONS

Notice of Rejection: JP Pat. Appln. 2004-020474; mailed Sep. 4, 2007; pp. 1, 1-4.

First Notice of Rejection: Chinese Pat. Appln. 2004-101048396; Apr. 20, 2007; pp. 1-8, pp. 1-2.

Explanation on an Accelerated Examination of JP 2007-318290; pp. 1-38.

Explanation on an Accelerated Examination of JP 2007-287544; pp. 1-38.

* cited by examiner

SEMICONDUCTOR DEVICE

Matter enclosed in heavy brackets [ ] appears in the original patent but forms no part of this reissue specification; matter printed in italics indicates the additions made by reissue.

*CROSS-REFERENCE TO RELATED APPLICATIONS*

*More than one reissue application has been filed for the reissue of U.S. Pat. No. 7,145,224. The reissue applications are application Ser. No. 12/821,999 (the present application) and Ser. No. 12/130,782, now U.S. Pat. No. Re. 41,869, both of which are reissues of U.S. Pat. No. 7,145,224.*

CLAIM OF PRIORITY

Claim of priority the present application claims priority from Japanese application serial no. 2004-020474, filed on Jan. 28, 2004, the content of which is hereby incorporated by reference into this application.

BACKGROUND OF THE INVENTION

The present invention relates to a semiconductor device, and specifically to a technology which effectively applies to a semiconductor device in which a plurality of semiconductor chips are encapsulated in a sealed body.

In a conventional semiconductor device, the rear surface of a heat sink (first conductive member) is soldered on the upper surface of each semiconductor chip, and the upper surface of a second conductive member is soldered on the rear surface of each semiconductor chip. Furthermore, the rear surface of a third conductive member is soldered on the upper surface of the heat sink, and the land of the prescribed semiconductor chip has an electrical connection to a control terminal via a bonding wire. The semiconductor chips, heat sink, upper surface of the second conductive member, rear surface of the third conductive member, and a part of the bonding wire and control terminal are encapsulated within resin. Japanese Application Patent Laid-open Publication No. 2002-110893, FIG. 1.

In the above semiconductor device, an external cooling member abuts on the rear surface of the second conductive member with a plate-like insulating member interposed in order to accelerate the heat dissipation. See Japanese Application Patent Laid-open Publication No. 2003-46036, FIG. 1.

SUMMARY OF THE INVENTION

Recently, semiconductor devices have been highly integrated and the size of the device has been reduced. Especially, a semiconductor device in which a plurality of semiconductor chips are encapsulated within an insulating material is called a multi-chip-module (MCM) and is widely developed.

One application of the above-mentioned MCM is a switching circuit used for a power-supply circuit. Among those, an insulated DC/DC converter is widely used for information devices such as personal computers. Such products are required to be highly efficient and small because central processing units (CPU) are using larger current and higher frequency.

A DC/DC converter consists of two power MOSFETS (Metal Oxide Semiconductor Field Effect Transistor), one for control and one for synchronization, a driver IC (integrated circuit) for turning the MOSFETS on and off, and other components such as a choke coil and capacitor. Generally, in an MCM for a DC/DC converter, two power MOSFETS and one driver IC are encapsulated in one package.

The objective of encapsulating a plurality of semiconductor chips in one package (sealed body) is to reduce the package area as well as reduce parasitic components such as parasitic inductances and resistances located on the circuit.

Moreover, because a power-supply circuit uses large current and high frequency, parasitic components cause significant power loss. To prevent that problem, it is necessary to shorten the wiring patterns between chips, between the driver IC and MOSFETS, and between the output terminal and a load. In a power-supply MCM, a driver IC and MOSFETS are located near each other and encapsulated together, and semiconductor elements constituting a power-supply circuit are integrated in one package. This configuration allows the MCM to be mounted extremely close to the load. Therefore, it is expected that the MCM will be the most commonly used power-supply device.

That is, when compared to a conventional packaging method in which individually-packaged elements are arrayed on a printed board, in the above-mentioned MCM, the wiring distance is shorter and parasitic inductances and resistances are significantly reduced, thereby enabling a low-loss circuit.

Although, in an MCM, encapsulating a plurality of semiconductor chips in one package reduces the package area, there is a problem in that the heat dissipation capability is reduced.

Furthermore, as shown in a comparative example in FIG. 16 which the inventor of the present invention has been studying, in an MCM, wires are used for major current paths between the chips and frame to enable electrical connections. Therefore, wires make up a significant portion of all the parasitic components. As a result, there is a problem in that parasitic components such as parasitic resistances and inductances in those wires increase.

An objective of the present invention is to provide a semiconductor device which is capable of improving the electrical characteristics.

Furthermore, another objective of the present invention is to provide a semiconductor device which is capable of improving the capability of dissipating heat.

The above-mentioned and other objectives, and novel features will become more apparent as the description in this specification proceeds with reference to the accompanying drawings.

Major embodiments of the present invention disclosed in this application are briefly described as shown below:

That is, a semiconductor device according to the present invention comprises a plurality of semiconductor chips, each of which has a terminal on its principal surface, a plate-like conductive member which has electrical connections to at least two semiconductor chips' terminals among the plurality of semiconductor chips, a sealed body which encapsulates the plurality of semiconductor chips, and a plurality of external connection terminals which have individual electrical connections to the plurality of semiconductor chips, wherein the at least two semiconductor chips which are connected by the plate-like conductive member have an individual transistor circuit, and the plate-like conductive member is exposed outside the sealed body.

Furthermore, a semiconductor device according to the present invention comprises a plurality of semiconductor chips, each of which has a terminal on its principal surface, a plate-like conductive member which has electrical connections to at least two semiconductor chips' terminals among the plurality of semiconductor chips, a sealed body which encapsulates the plurality of semiconductor chips by resin, and a plurality of external connection terminals which have individual electrical connections to the plurality of semiconductor chips, wherein the plate-like conductive member is exposed outside the sealed body, and the connecting portion of the plate-like conductive member at which the plate-like conductive member is connected to one semiconductor chip is joined to the connecting portion at which the plate-like conductive member is connected to the other semiconductor chip, on either the principal or rear surface of the sealed body, or on the outside of the semiconductor chips inside the sealed body.

Furthermore, a semiconductor device according to the present invention comprises a plurality of semiconductor chips, each of which has a terminal on its principal surface, a plate-like conductive member which has electrical connections to at least two semiconductor chips' terminals among the plurality of semiconductor chips, a sealed body which encapsulates the plurality of semiconductor chips by resin, and a plurality of external connection terminals which have individual electrical connections to the plurality of semiconductor chips and are disposed on the peripheral edge of the rear surface of the sealed body, wherein the plate-like conductive member is exposed on the at least either principal or rear surface of the sealed body.

Furthermore, in a semiconductor device according to the present invention, a plurality of semiconductor chips are encapsulated, wherein major current paths between elements or between terminals and elements have electrical connections made possible by a plate-like conductor, and at least three conductors having different potentials are partially exposed on either the upper or rear surface of the semiconductor device, or on both surfaces.

Furthermore, in a semiconductor device according to the present invention, a plurality of semiconductor chips are connected in series by a plate-like conductor, and a plurality of semiconductor chips are connected to the same surface of the conductor, wherein among a plurality of semiconductor chips consisting of the semiconductor device, one or more semiconductor chips are disposed upside down and encapsulated.

For an example, in an MCM for a DC/DC converter, the control power MOSFET chip's drain terminal has an electrical connection to the input terminal, which is an external connection terminal, via a plate-like conductor, or is directly connected to a plate-like conductor which is a part of the input terminal, and similarly, the synchronous power MOSFET chip's source terminal has an electrical connection to the ground terminal, which is an external connection terminal, via a plate-like conductor, or is directly connected to a plate-like conductor which is a part of the ground terminal.

Furthermore, the control power MOSFET chip's source terminal and the synchronous power MOSFET chip's drain terminal are individually connected to plate-like conductors, and the plate-like conductors are connected to each other by a certain conductor, or the control power MOSFET chip's source terminal and the synchronous power MOSFET chip's drain terminal are connected to a part of a common conductor.

Furthermore, the conductor has an electrical connection to the output terminal which is an external connection terminal, or is a part of the output terminal.

Furthermore, a plate-like conductor which is connected to the input terminal, ground terminal and output terminal or is a part of the terminals is partially or entirely exposed outside the insulating material which encapsulates the semiconductor device.

Furthermore, a common plate-like conductor is used to connect the control power MOSFET chip's source terminal and the synchronous power MOSFET chip's drain terminal, and the synchronous power MOSFET is connected upside down to the common surface of the conductor.

DESCRIPTION OF THE PREFERRED EMBODIMENTS

In the following embodiments, the same or similar parts will not be repeatedly described unless specifically necessary.

Furthermore, as a matter of convenience, in the following embodiments, a plurality of separate sections or embodiments will be explained when necessary. However, those separate sections or embodiments are all related unless otherwise specified, and one section may be a part of or the whole of an altered example, or a description may be a detailed or supplementary explanation.

Moreover, in the following embodiments, when the number of elements (including the number of items, numeric value, quantity, and range) is mentioned, the number of elements is not limited to a specific number and could be more or less unless otherwise specified, or unless the number of elements is obviously limited to a specific number in principle.

Hereafter, embodiments of the present invention will be explained in detail with reference to the drawings. In all of the drawings used for explaining the embodiments, members that have the same function have been assigned the same numbers to avoid repeated explanations.

(Embodiment 1)

Figure 1:
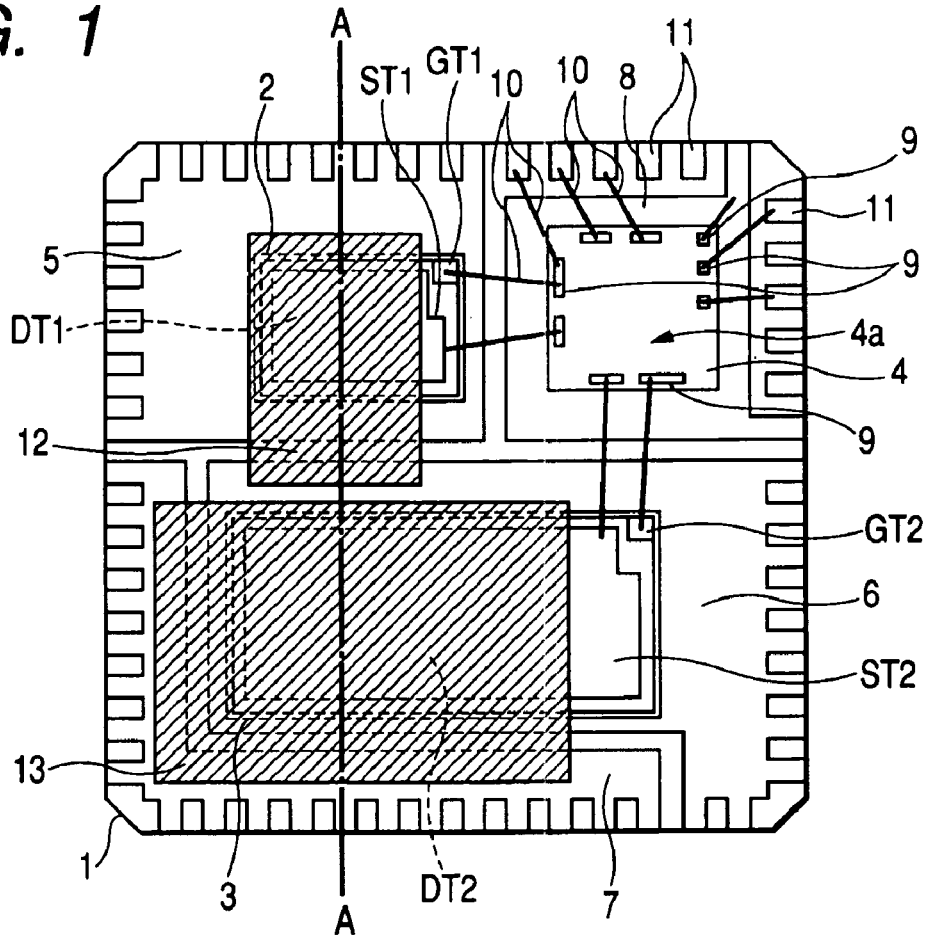
FIG. 1 is a plan view, seen through a sealed body, showing an example of the structure of a semiconductor device (multiple chip module for a non-insulated DC/DC converter) according to embodiment 1 of the present invention.
Figure 2:
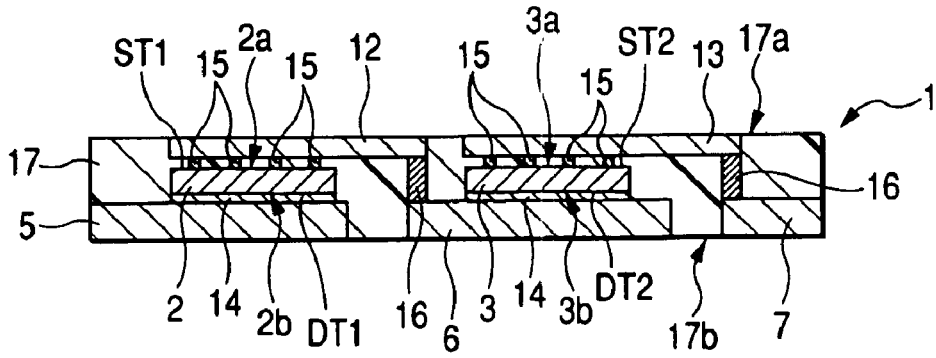
FIG. 2 is a cross-sectional view showing the cross-sectional structure taken substantially along the lines A-A in FIG. 1.
Figure 3:
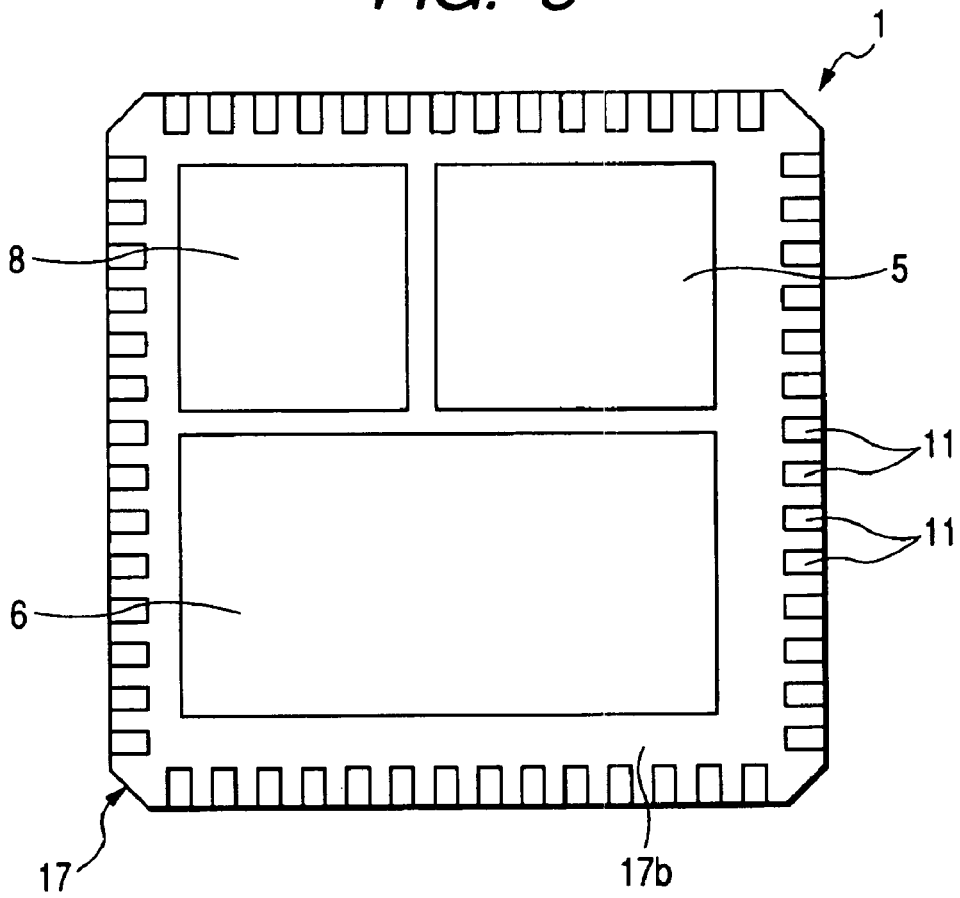
FIG. 3 is a drawing of the rear surface showing the structure of the semiconductor device shown in FIG. 1.
Figure 4:
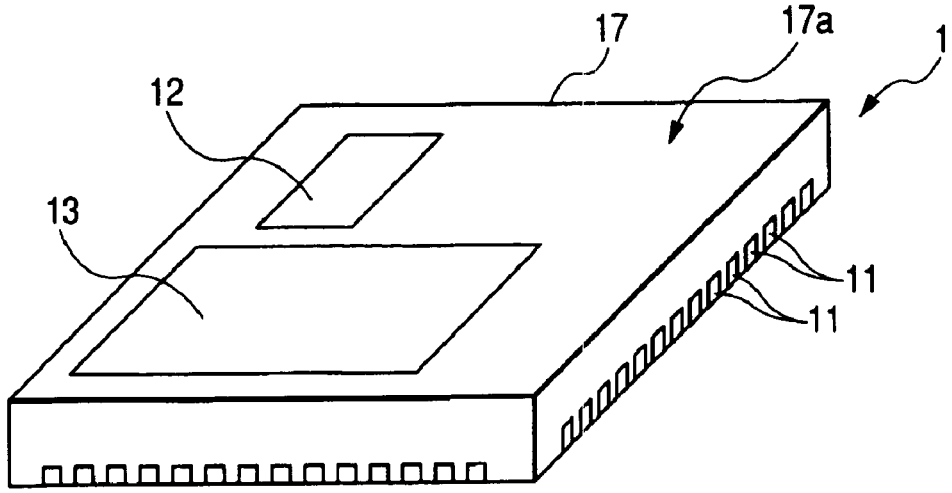
FIG. 4 is an outside perspective view showing the structure of the semiconductor device shown in FIG. 1.
Figure 5:
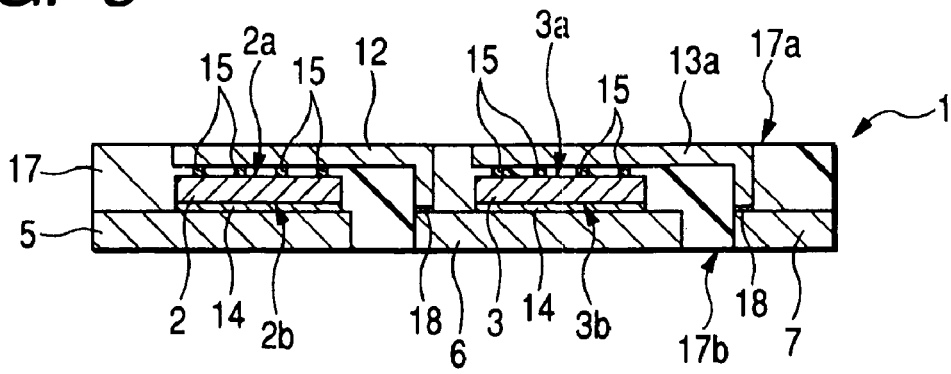
FIG. 5 is a cross-sectional view showing the structure of a semiconductor device which is an altered example according to embodiment 1 of the present invention.
Figure 6:
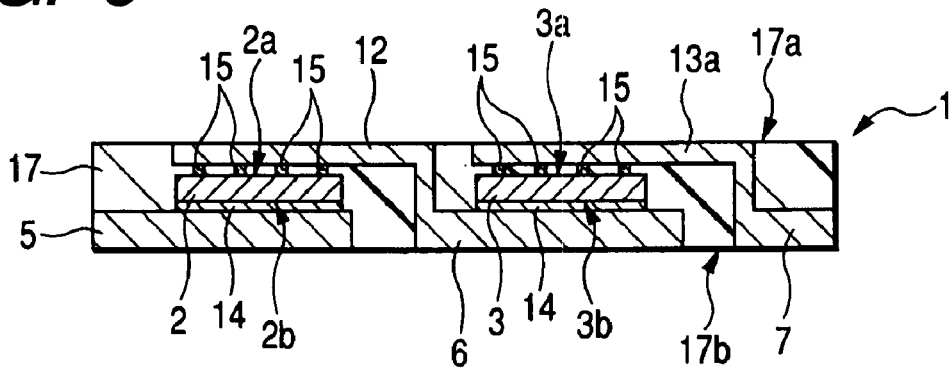
FIG. 6 is a cross-sectional view showing the structure of a semiconductor device which is an altered example according to embodiment 1 of the present invention.
Figure 7:
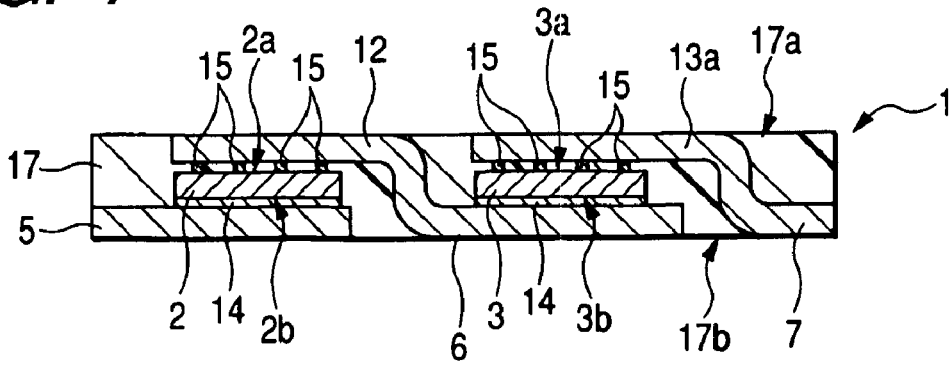
FIG. 7 s a cross-sectional view showing the structure of a semiconductor device which is an altered example according to embodiment 1 of the present invention.
Figure 8:
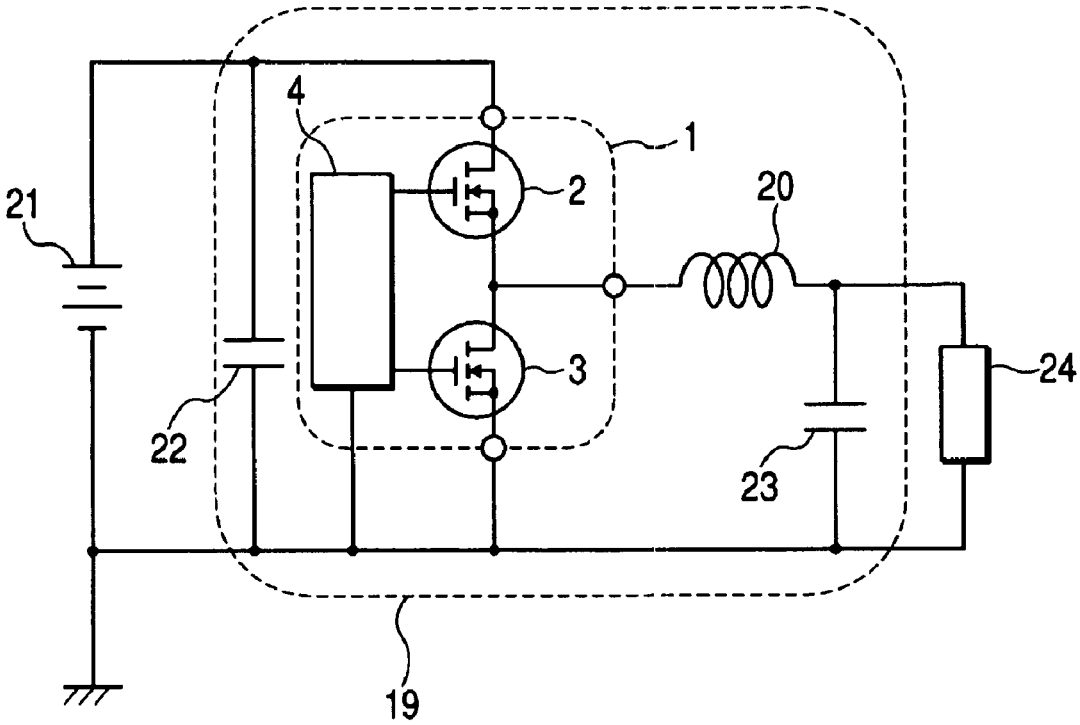
FIG. 8 is a circuit diagram showing an example of an equivalent circuit when the MCM 1 shown in FIG. 1 is mounted on the semiconductor device (non-insulated DC/DC converter)
Figure 16:
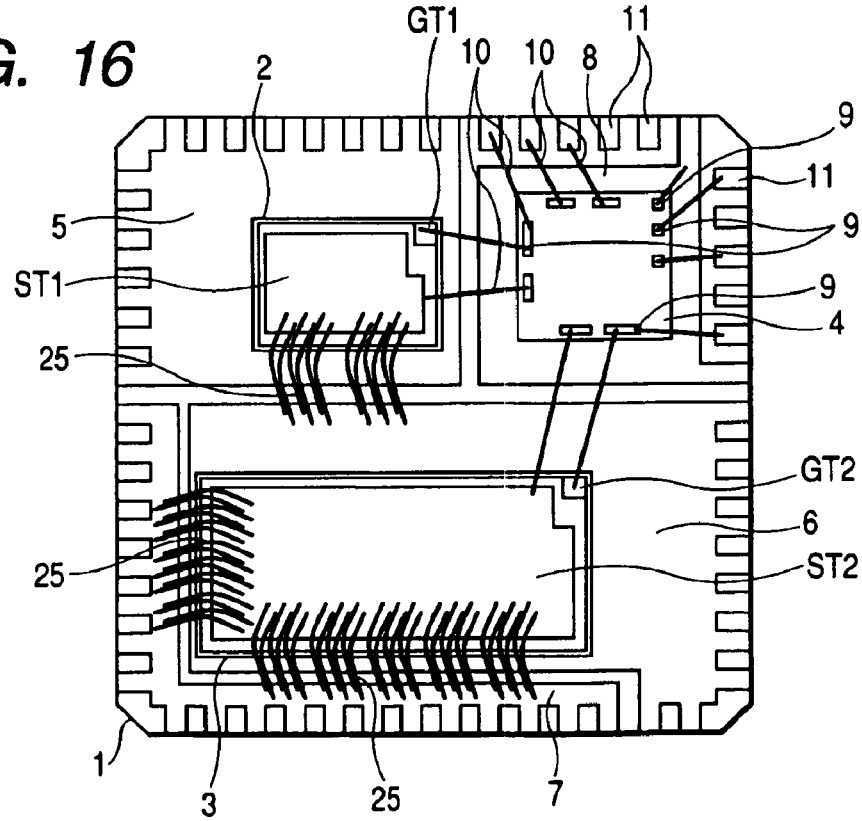
FIG. 16 is a plan view, seen through a sealed body, showing the structure of a power-supply multiple chip module which is a comparative example.
Figure 17:
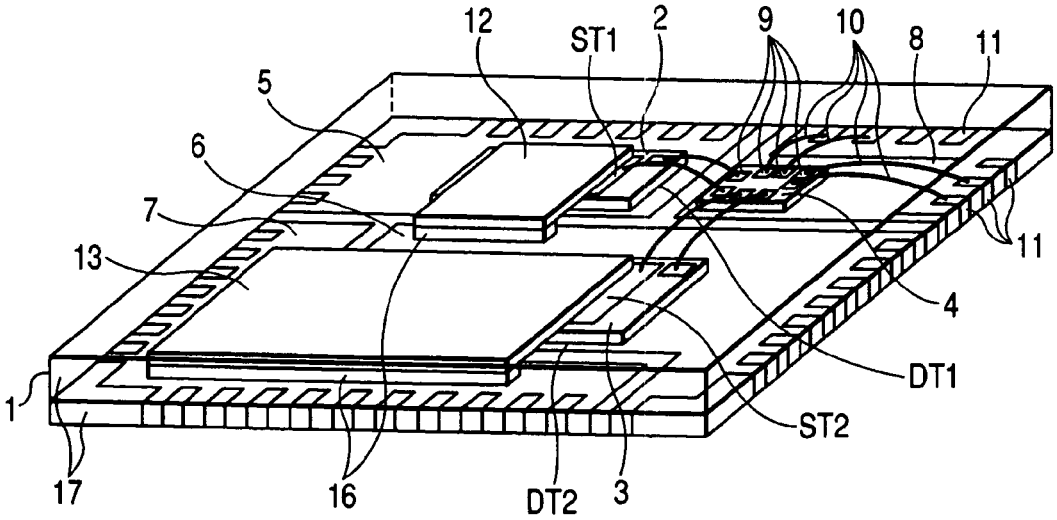
FIG. 17 is a perspective view, seen through a sealed body, showing the inside of the semiconductor device shown in FIG. 1.

FIG. 1 is a plan view, seen through a sealed body, showing an example of the structure of a semiconductor device (multiple chip module for a non-insulated DC/DC converter) according to embodiment 1 of the present invention. FIG. 17 is a perspective view, seen through a sealed body, showing the inside of the semiconductor device shown in FIG. 1. FIG. 2 is a cross-sectional view showing the cross-sectional structure taken substantially along the lines A-A in FIG. 1. FIG. 3 is a drawing of the rear surface showing the structure of the semiconductor device shown in FIG. 1. FIG. 4 is an outside perspective view showing the structure of the semiconductor device shown in FIG. 1. FIGS. 5 through 7 are cross-sectional views showing the structure of a semiconductor device which is an altered example according to embodiment 1 of the present invention. FIG. 8 is a circuit diagram showing an example of an equivalent circuit when the MCM 1 shown in FIG. 1 is mounted on the semiconductor device (non-insulated DC/DC converter). FIG. 16 is a plan view, seen through a sealed body, showing the structure of a power-supply multiple chip module which is a comparative example.

In a semiconductor device according to embodiment 1, shown in FIGS. 1 through 4 and 17, a plurality of semiconductor chips are encapsulated in one sealed body (insulating resin for sealing) 17. In embodiment 1, an MCM (multiple chip module) 1 for a non-insulated DC/DC converter is explained as one example of the above-mentioned semiconductor device.

Furthermore, as shown in FIG. 3, an MCM 1 has a non-leaded QFN (Quad Flat Non-leaded Package) structure in which a plurality of external connection terminals 11 are disposed on the peripheral edge of the rear surface 17b of the sealed body 17.

The MCM 1 according to embodiment 1 basically consists of a plurality of semiconductor chips, a plate-like conductive member which has electrical connections to at least two semiconductor chips' terminals among those semiconductor chips, a sealed body 17 which encapsulates the plural semiconductor chips, and a plurality of external connection terminals 11 disposed on the peripheral edge of the rear surface 17b of the sealed body 17. Furthermore, in the MCM 1, at least two semiconductor chips connected by the plate-like conductive member have an individual transistor circuit, and the plate-like conductive member is exposed outside the sealed body 17.

Moreover, the MCM 1 has a control power MOSFET chip 2 (first semiconductor chip), a synchronous power MOSFET chip 3 (second semiconductor chip) which has an electrical connection in series to the control power MOSFET chip 2 by a plate-like conductive member, and a driver IC chip 4 (third semiconductor chip) which turns on and off those semiconductor chips. The three semiconductor chips are sealed (encapsulated) in the sealed body 17.

That is, the MCM 1 has two semiconductor chips (first and second semiconductor chips) each of which has a power-supply transistor circuit, and one semiconductor chip (third semiconductor chip) which has a driver circuit for controlling the two semiconductor chips.

The detailed structure of the MCM 1 according to embodiment 1 will be explained. As shown in FIGS. 1 and 2, a control power MOSFET chip (first transistor) 2 is disposed on the input-side plate-like lead (first plate-like conductive member) 5. That is, a terminal which functions as a drain terminal DT1 (first output electrode) of the control power MOSFET is formed on the rear surface 2b of the control power MOSFET chip 2, and the input-side plate-like lead 5 which is a first plate-like conductive member is connected to the drain terminal DT1.

On the principal surface 2a of the control power MOSFET chip 2, terminals which function as the control power MOSFET chip's source terminal (second output electrode) ST1 and gate terminal (input electrode) GT1 are formed, and the source terminal ST1 located on the principal surface 2a of the control power MOSFET chip 2 is connected to the plate-like lead for source 12 which is a second plate-like conductive member.

Furthermore, a synchronous power MOSFET chip (second transistor) 3 is disposed on the output-side plate-like lead 6. That is, a terminal which functions as a drain terminal (first output terminal) DT2 of the synchronous power MOSFET is formed on the rear surface 3b of the synchronous power MOSFET chip 3, and the output-side plate-like lead 6 which is a third plate-like conductive member is connected to the drain terminal DT2. On the principal surface 3a of the synchronous power MOSFET chip 3, terminals which function as the synchronous power MOSFET chip's source terminal ST2 and gate terminal (input electrode) GT2 are formed, and the source terminal ST2 located on the principal surface 3a of the synchronous power MOSFET chip 3 is connected to the plate-like lead for source 13 which is a fourth plate-like conductive member.

Furthermore, the MCM 1 has a ground-side plate-like lead 7 and a driver-side plate-like lead 8, and a driver IC chip 4 is disposed on the driver-side plate-like lead 8. That is, the driver IC chip 4 and the driver-side plate-like lead 8 are connected to each other. On the driver IC chip 4, some terminals 9 among a plurality of terminals 9 located on the principal surface 4a of the driver IC chip 4 are electrically connected to the power MOSFET chips' gate terminal GT1, source terminal ST1, gate terminal GT2 and source terminal ST2 by wires 10, such as gold wires or thin metal wires, thereby the power MOSFETS are turned on and off.

Other terminals 9 located on the principal surface 4a of the driver IC chip 4 are a power supply voltage terminal, boot terminal, voltage check terminal and a control signal input terminal, and each of the terminals is connected to a corresponding external connection terminal 11 by a wire 10.

As shown in FIG. 3, the input-side plate-like lead 5, output-side plate-like lead 6, and driver-side plate-like lead 8, each of which has an installed semiconductor chip, are partially or entirely exposed on the rear surface 17b of the sealed body 17 of the MCM 1. Those leads function as external connection terminals that have electrical connections to the printed wiring board as well as function as heat radiating parts that dissipates heat on the printed wiring board.

As FIGS. 1 and 2 show, the plate-like lead for source 12 provides an electrical connection between the source terminal ST1 of the control power MOSFET chip 2 and the output-side plate-like lead 6. Similarly, the plate-like lead for source 13 provides an electrical connection between the source terminal ST2 of the synchronous power MOSFET chip 3 and the ground-side plate-like lead 7.

Moreover, as FIG. 4 shows, the plate-like lead for source 12 and the plate-like lead for source 13 are partially exposed on the upper surface 17a of the sealed body 17 of the MCM 1.

Furthermore, as FIG. 2 shows, drain terminals DT1 and DT2 located on the rear surfaces 2b and 3b of the control power MOSFET chip 2 and the synchronous power MOSFET chip 3 are joined to the input-side plate-like lead 5 and the output-side plate-like lead 6, respectively, with die bonding material, such as silver paste 14, interposed.

On the other hand, source terminals ST1 and ST2 located on the principal surfaces 2a and 3a of the control power MOSFET chip 2 and the synchronous power MOSFET chip 3 are joined to the plate-like leads for source 12 and 13, respectively, via a plurality of protruding conductive electrodes such as gold bumps 15.

It is possible to use protruding solder electrodes or paste-like conductive adhesives to join the source terminals ST1 and ST2 located on the principal surfaces 2a and 3a of the control power MOSFET chip 2 and the synchronous power MOSFET chip 3, respectively, to the plate-like leads for source 12 and 13.

FIGS. 2, 5, 6 and 7 show various types of connections between the second plate-like conductive member and the third plate-like conductive member, and between the fourth plate-like conductive member and the ground-side plate-like lead 7.

As shown in FIG. 2, the plate-like lead for source 12 has an electrical connection to the output-side plate-like lead 6 via a conductor 16, and the plate-like lead for source 13 has an electrical connection to the ground-side plate-like lead 7 via a conductor 16. Furthermore, as shown in an altered example in FIG. 5, it is possible to create the portions between the plate-like leads for source 12a and 13a and the connections to the output-side plate-like lead 6 and the ground-side plate-like lead 7, respectively, so that those portions become the same conductive members as the leads and then provide electrical connections by using solder 18. A conductive member (second conductive member or third conductive member) which consists of a plate-like lead for source 12, conductor 16, and an output-side plate-like lead 6 has two bends which forms a nearly S-shape.

Furthermore, as shown in altered examples in FIGS. 6 and 7, it is possible to integrate the plate-like lead for source (second plate-like conductive member) 12 and the output-side plate-like lead (third plate-like conductive member) 6, and also integrate the plate-like lead for source 13 and the ground-side plate-like lead 7. In an altered example shown in FIG. 6, leads are integrated by press work. In an altered example shown in FIG. 7, leads are integrated by bending work.

Thus, in the MCM 1 according to embodiment 1, the plate-like lead for source 12 located on the upper-surface 17a side of the sealed body 17 is joined and electrically connected to the output-side plate-like lead 6 located on the rear surface 17b side of the sealed body 17, on the outside of the control power MOSFET chip 2 and the synchronous power MOSFET chip 3, inside the sealed body 17.

Next, FIG. 8 shows an example of an equivalent circuit when the MCM 1 is mounted. The MCM 1 is connected by a coil 20, capacitors 22 and 23, load 24 and an input power source 21 by wires. In a non-insulated DC/DC converter circuit 19, heat is mostly generated by the control power MOSFET chip 2 and the synchronous power MOSFET chip 3.

According to an MCM 1 of embodiment 1, one surface of the plate-like conductive member which functions as a current path is connected to a semiconductor chip and the other surface is exposed outside the sealed body 17, thereby making it possible to increase the capability of dissipating heat. The plate-like conductive member exposed on the rear surface 17b of the sealed body 17 functions as an external connection terminal and is also capable of dissipating heat on the printed wiring board where the MCM 1 is mounted. Furthermore, the plate-like conductive member exposed on the upper surface 17a of the sealed body 17 directly dissipates heat in the ambient air or increases the heat conductivity to a heat radiating member, such as a heat radiating fin 27 (see FIGS. 13 and 14) or heat sink, mounted on the MCM 1.

That is, heat generated by the control power MOSFET chip 2 and the synchronous power MOSFET chip 3 is conveyed from the input-side plate-like lead 5 and the output-side plate-like lead 6, which are exposed on the rear surface 17b of the sealed body 17, to the printed wiring board, thereby dissipating the heat. Furthermore, heat can be externally dissipated from the plate-like lead for source 12 and the plate-like lead for source 13 which are exposed on the upper surface 17a of the sealed body 17, thereby increasing the heat dissipation capability.

As a result, it is possible to increase the heat dissipation capability in the MCM 1. It is also possible to increase the voltage conversion efficiency of the MCM 1.

Furthermore, in an MCM 1 according to embodiment 1, the source terminal ST1 of the control power MOSFET chip 2 is connected to the output-side plate-like lead 6 by the plate-like leads for source 12, and the source terminal ST2 of the synchronous power MOSFET chip 3 is connected to the ground-side plate-like lead 7 by the plate-like leads for source 13. Therefore, when compared to a multiple chip module in a comparative example, shown in FIG. 16, which uses ordinary wire connections using wires 25 such as gold wires, the cross-sectional area of the current path can be made larger in the MCM 1 according to embodiment 1. As a result, parasitic components, such as parasitic resistances and inductances, are reduced, which makes it possible to increase the conversion efficiency.

That is, it is possible to reduce parasitic resistances and parasitic inductances compared to the situations where wire connections are used, thereby making it possible to increase the electrical characteristics of the MCM 1.

Furthermore, it is possible to easily manufacture a reliable semiconductor device by connecting in series the current path between the first transistor's first output electrode and second output electrode to the current path between the second transistor's first output electrode and second output electrode, and mechanically integrating the first, second and third conductive members, and first and second transistors.

(Embodiment 2)

Figure 9:
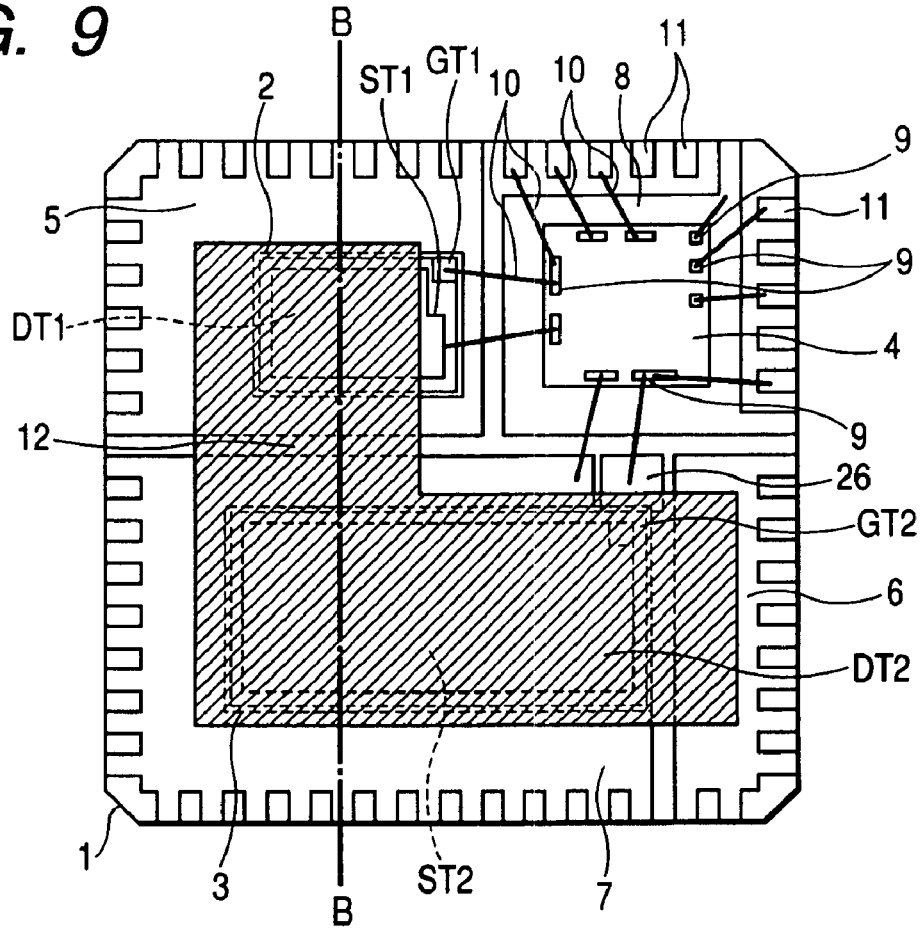
FIG. 9 is a plan view, seen through a sealed body, showing an example of the structure of a semiconductor device (multiple chip module for a non-insulated DC/DC converter) according to embodiment 2 of the present invention.
Figure 10:
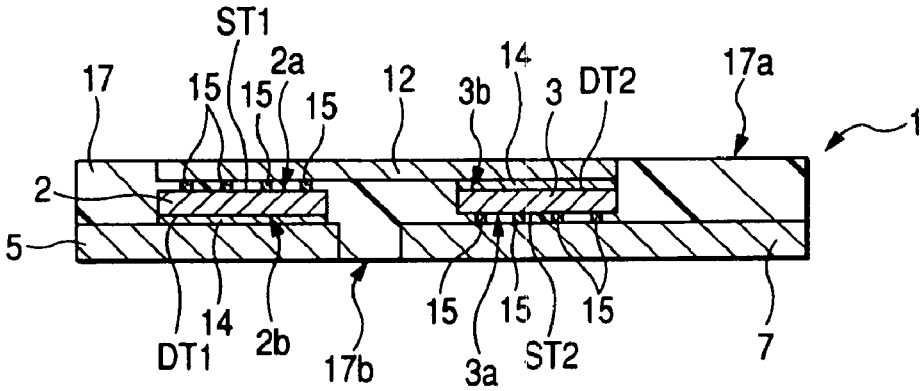
FIG. 10 is a cross-sectional view showing the cross-sectional structure taken substantially along the lines B-B in FIG. 9.
Figure 11:
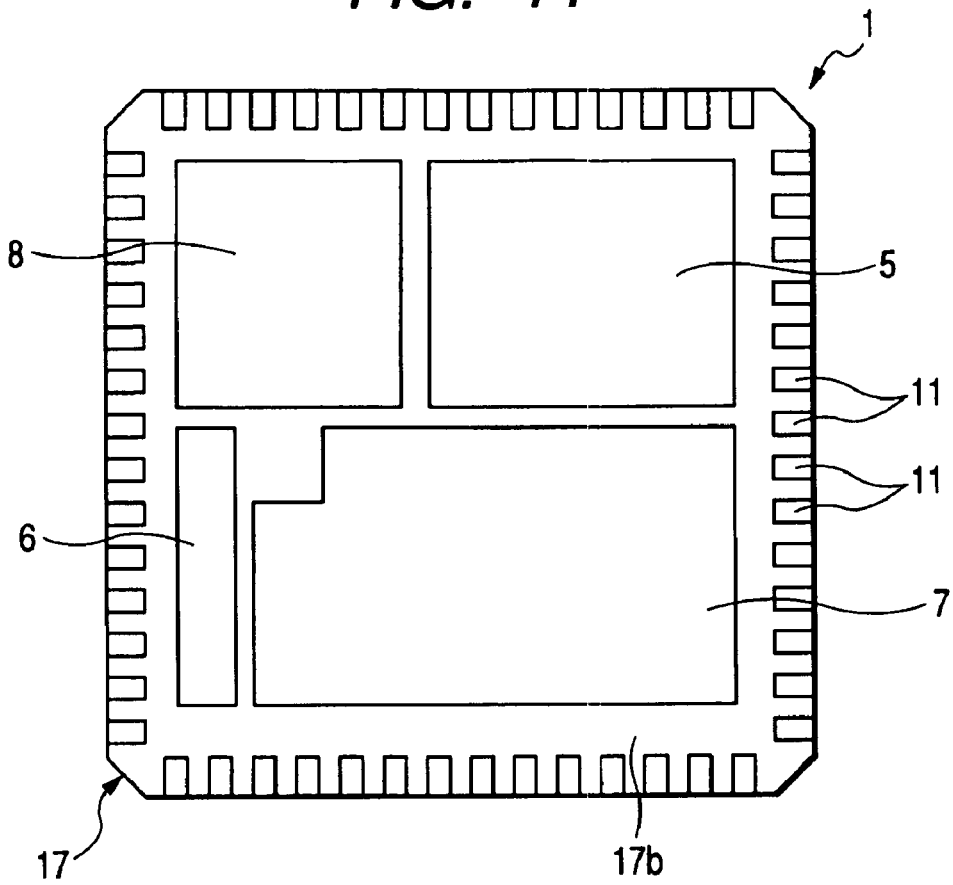
FIG. 11. is a drawing of the rear surface showing the structure of the semiconductor device shown in FIG. 9.
Figure 12:
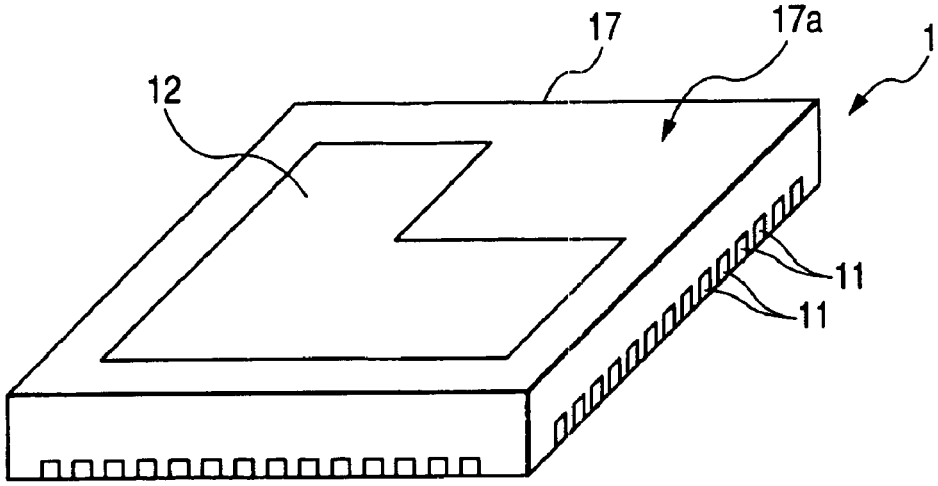
FIG. 12 is an outside perspective view showing the structure of the semiconductor device shown in FIG. 9.

FIG. 9 is a plan view, seen through a sealed body, showing an example of the structure of a semiconductor device (multiple chip module for a non-insulated DC/DC converter) according to embodiment 2 of the present invention. FIG. 10 is a cross-sectional view showing the cross-sectional structure taken substantially along the lines B-B in FIG. 9. FIG. 11 is a drawing of the rear surface showing the structure of the semiconductor device shown in FIG. 9. FIG. 12 is an outside perspective view showing the structure of the semiconductor device shown in FIG. 9.

Similar to embodiment 1, a semiconductor device according to embodiment 2 is an MCM (multiple chip module) 1 for a non-insulated DC/DC converter. The semiconductor device is a semiconductor package in which a control power MOSFET chip 2, synchronous power MOSFET chip 3 and a driver IC chip 4 which turns on and off those power MOSFET chips are encapsulated.

The structure of the MCM 1 according to embodiment 2 will be described. As FIGS. 9 and 10 show, a control power MOSFET chip 2 is disposed on an input-side plate-like lead 5. And, terminals which function as the control power MOSFET chip's source terminal ST1 and gate terminal GT1 are formed on the principal surface 2a of the control power MOSFET chip 2. Furthermore, a terminal which functions as the control power MOSFET chip's drain terminal DT1 is formed on the rear surface 2b of the control power MOSFET chip 2.

On the other hand, what is different from embodiment 1 is that a synchronous power MOSFET chip 3 is disposed on the ground-side plate-like lead 7. That is, as shown in FIG. 10, the synchronous power MOSFET chip 3, which is a second semiconductor chip, is disposed reversely (principal and rear surfaces upside down) compared to the control power MOSFET chip 2 which is a first semiconductor chip. Moreover, a terminal which functions as the synchronous power MOSFET chip's drain terminal DT2 is formed on the principal surface 3a of the synchronous power MOSFET chip 3, and terminals which function as the synchronous power MOSFET chip's source terminal ST2 and gate terminal GT2 are formed on the rear surface 3b of the synchronous power MOSFET chip 3.

As FIG. 9 shows, the MCM 1 for a DC/DC converter has an output-side plate-like lead 6.

Furthermore, a driver IC chip 4 is disposed on the driver-side plate-like lead 8. Some of the terminals 9 located on the principal surface 4a of the driver IC chip 4 have electrical connections to the control power MOSFET chip's 2 gate terminal GT1 and source terminal ST1, and the synchronous power MOSFET chip's 3 source terminal ST2 and gate terminal GT2, thereby turning on and off each power MOSFET. Moreover, because the gate terminal GT2 is downwardly formed on the principal surface 3a, as shown in FIG. 9, some of the terminals 9 of the driver IC chip 4 are connected to the synchronous power MOSFET chip's 3 gate terminal GT2 by wires 10 with a metal plate 26 interposed. The gate terminal GT2 has an electrical connection to a metal plate 26 via bump electrodes, for example. Other terminals are a power supply voltage terminal, boot terminal, voltage check terminal, and a control signal input terminal. Each of the terminals is connected to a corresponding external connection terminal 11 by a wire 10.

As shown in FIG. 11, the input-side plate-like lead 5, output-side plate-like lead 6, ground-side plate-like lead 7 and driver-side plate-like lead 8 are partially or entirely exposed on the rear surface 17b of the sealed body 17. Thus, those plate-like leads function as external connection terminals which have electrical connections to the printed wiring board as well as function as heat radiating parts which dissipate heat on the printed wiring board.

However, it is not necessary to expose all of the plate-like leads. For example, it is possible that only the output-side plate-like lead 6 is hidden.

Furthermore, the plate-like lead for source 12 provides electrical connections between the source terminal ST1 of the control power MOSFET chip 2 and the drain terminal DT2 of the synchronous power MOSFET chip 3. As shown in FIG. 12, the plate-like lead for source 12 is partially exposed on the upper surface 17a of the sealed body 17.

Therefore, in an MCM 1 according to embodiment 2, as shown in FIG. 9, the connecting portion of the plate-like lead for source 12 (second plate-like conductive member) at which the lead connects to the control power MOSFET chip 2 (one semiconductor chip) is joined to the connecting portion at which the lead connects to the synchronous power MOSFET chip 3 (the other semiconductor chip) on the upper surface 17a of the sealed body 17.

Moreover, the surface of the control power MOSFET chip 2 on which the drain terminal DT1 is formed is pressure-bonded to the input-side plate-like lead 5, for example, via a die bonding material such as silver paste 14, and the source terminal ST1 located on the opposite surface is connected to the plate-like lead for source 12, for example, via a conductive material such as a gold bump 15.

On the other hand, the surface of the synchronous power MOSFET chip 3 on which the drain terminal DT2 is formed is pressure-bonded to the plate-like lead for source 12, for example, via a die bonding material such as silver paste 14, and the source terminal ST2 located on the opposite surface is connected to the ground-side plate-like lead 7, for example, via a conductive material such as a gold bump 15.

In an MCM 1 according to embodiment 2, by installing at least one semiconductor chip upside down, it is possible to make manufacturing of the plate-like lead for source 12 much easier than that of an MCM 1 according to embodiment 1. That is, as shown in FIG. 10, it is possible to connect the source terminal ST1 of the control power MOSFET chip 2 and the drain terminal DT2 of the synchronous power MOSFET chip 3 onto the same surface of the plate-like lead for source 12 by using only one plate-like lead for source 12. Therefore, it is possible to avoid the complicated manufacturing process in which a plurality of semiconductor chips are connected on the different surfaces of the plate-like lead for source 12. As a result, it is possible to reduce the time to connect and manufacture leads. Thus, the structure of the MCM 1 can be simplified.

Furthermore, because the plate-like lead for source 12 can be formed by using only one plate-like lead, it is possible to make the area of the plate-like lead for source 12 larger than that of the MCM 1 according to embodiment 1. As a consequence, the heat dissipation capability can be increased and the voltage conversion efficiency can also be increased.

(Embodiment 3)

Figure 13:
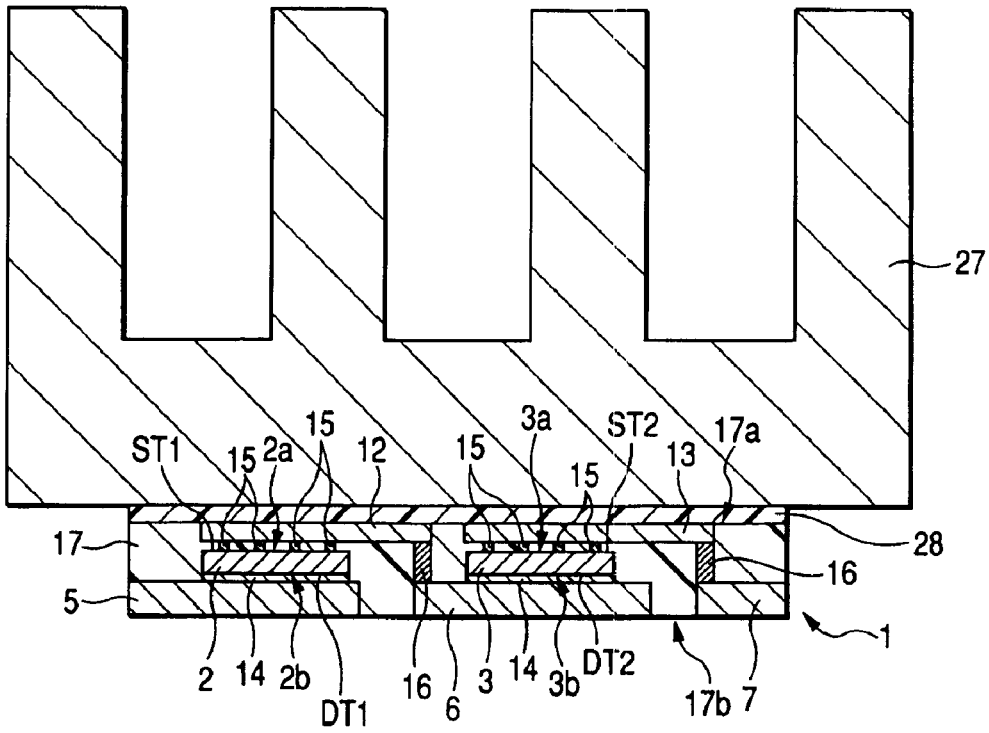
FIG. 13 is a cross-sectional view showing an example of the structure of a semiconductor device (multiple chip module for a non-insulated DC/DC converter) according to embodiment 3 of the present invention.
Figure 14:
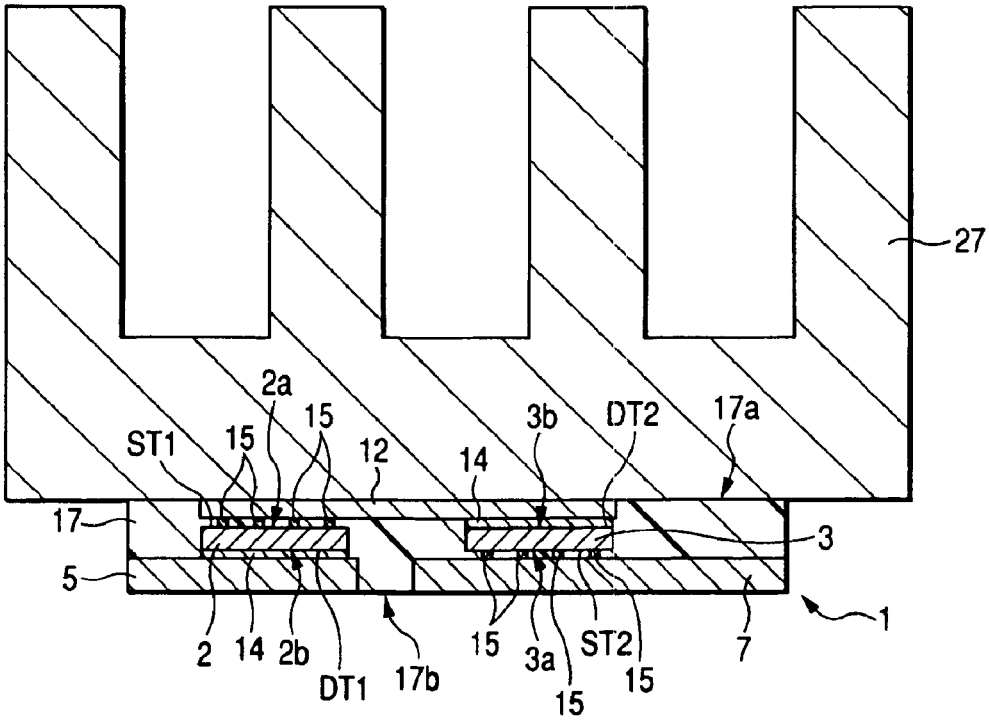
FIG. 14 is a cross-sectional view showing the structure of a semiconductor device which is an altered example according to embodiment 3 of the present invention.

FIG. 13 is a cross-sectional view showing an example of the structure of a semiconductor device (multiple chip module for a non-insulated DC/DC converter) according to embodiment 3 of the present invention. FIG. 14 is a cross-sectional view showing the structure of a semiconductor device which is an altered example according to embodiment 3 of the present invention.

Similar to embodiments 1 and 2, a semiconductor device according to embodiment 3 is an MCM (multiple chip module) 1 for a non-insulated DC/DC converter. The structure which will increase the heat dissipation capability will be explained.

An MCM 1 shown in FIG. 13 is an MCM 1 in which a heat radiating fin 27 (heat radiating member) is mounted to the MCM 1 according to embodiment 1. That is, in an MCM 1 according to embodiment 1, two plate-like leads (plate-like leads for source 12 and 13) exposed on the upper surface 17a of the sealed body 17 have different potentials, and therefore, a heat radiating member such as a heat radiating fin 27 is installed with an insulating sheet 28 interposed.

Thus, by mounting a heat radiating fin 27 to the plate-like lead exposed on the upper surface 17a of the MCM 1, it is possible to increase the heat dissipation capability of the MCM 1.

Furthermore, an MCM 1 shown in FIG. 14 is an MCM 1 in which a heat radiating fin 27 (heat radiating member) is mounted to the MCM 1 according to embodiment 2. In this MCM 1, only one plate-like lead for source 12 is exposed on the upper surface 17a of the sealed body 17. Therefore, the plate-like lead for source 12 can be directly connected to the heat radiating fin 27 without an insulating sheet 28 interposed. Consequently, it is possible to make the heat dissipation capability higher than that of the MCM 1 shown in FIG. 13.

Furthermore, it is also possible to integrate the plate-like lead for source 12 and the heat radiating fin 27, thereby making it possible to increase the heat dissipation capability.

(Embodiment 4)

Figure 15:
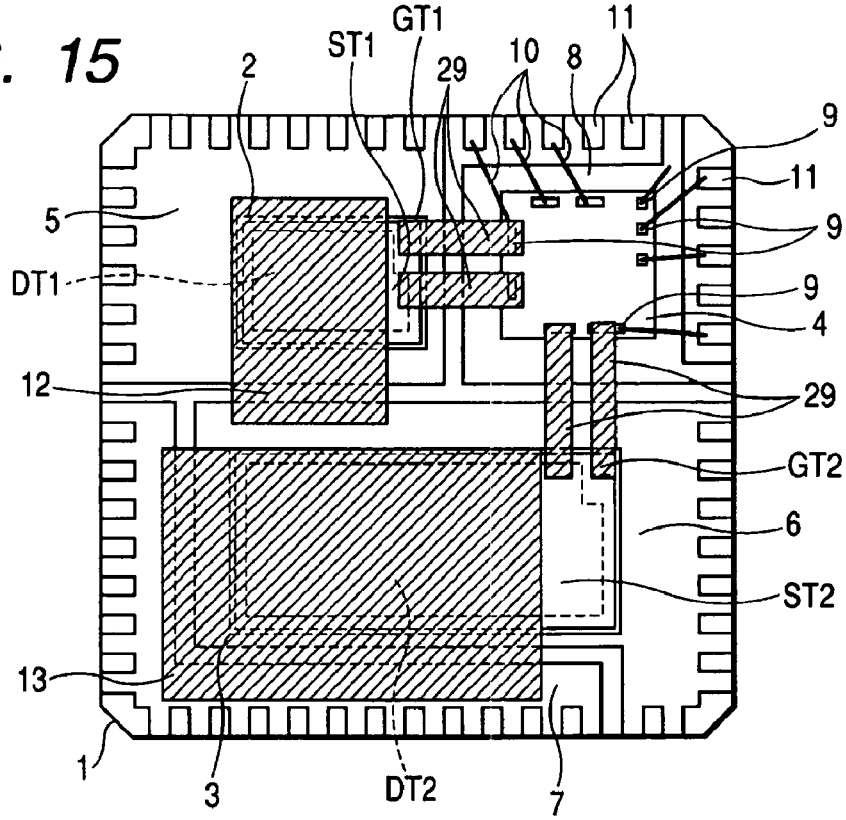
FIG. 15 is a plan view, seen through a sealed body, showing an example of the structure of a semiconductor device (multiple chip module for a non-insulated DC/DC converter) according to embodiment 4 of the present invention.

FIG. 15 is a plan view, seen through a sealed body, showing an example of the structure of a semiconductor device (multiple chip module for a non-insulated DC/DC converter) according to embodiment 4 of the present invention.

Similar to embodiments 1 and 2, a semiconductor device according to embodiment 4 is an MCM (multiple chip module) 1 for a non-insulated DC/DC converter. In an MCM 1 according to embodiments 1 and 2, wires 10 are used to connect the control power MOSFET chip's 2 source terminal ST1 and gate terminal GT1 to the driver IC chip's 4 terminals 9, or to connect the synchronous power MOSFET chip's 3 source terminal ST2 and gate terminal GT2 to the driver IC chip's 4 terminals 9. However, in an MCM 1 according to embodiment 4, metal plates (other plate-like conductive members) 29 are used for the connections of the gate drive circuits, or other connections.

That is, in an example shown in FIG. 15, the terminal of the control power MOSFET chip 2 has an electrical connection to a corresponding terminal 9 of the driver IC chip 4 by a metal plate 29, and the terminal of the synchronous power MOSFET chip 3 also has an electrical connection to a corresponding terminal 9 of the driver IC chip 4 by a metal plate 29. Furthermore, electrical connections between the terminals and metal plates 29 are provided, for example, by using gold bumps 15.

In the MCM 1, when the high-speed switching is selected, parasitic resistances and parasitic inductances, including a gate drive circuit, other than the main current path may cause the efficiency to decrease. Therefore, by connecting the driver IC chip 4 to the electrodes of the control power MOSFET chip 2 and synchronous power MOSFET chip 3 by using metal plates 29, it is possible to reduce the parasitic resistances and parasitic inductances compared to the situations where wire connections are used.

Moreover, other connections that use wires 10 as shown in FIG. 15 can be replaced with metal plates 29.

As stated above, the present invention provided by the inventor has been explained in detail according to the embodiments. However, the present invention is not intended to be limited to the above-mentioned embodiments, and can be embodied in a variety of forms as long as they do not depart from the concept of the present invention.

For example, in the above embodiments 1 through 4, the MCM 1 which is a QFN-type semiconductor device is explained. However, the MCM 1 is not intended to be limited to the QFN-type semiconductor device, and can be a semiconductor device of other structures such as a QFP (Quad Flat Package) type semiconductor device as long as a plurality of semiconductor chips are encapsulated in a sealed body. Furthermore, the number of encapsulated semiconductor chips is not intended to be limited to three, therefore, there can be four or more semiconductor chips.

The present invention is suitable for use in a semiconductor device or electronic device.

A major embodiment of the present invention disclosed in this application is briefly described as shown below:

Because the present invention has a plate-like conductive member to connect terminals of two semiconductor chips, it is possible to reduce parasitic resistances and parasitic inductances compared to the situations where wire connections are used, thereby increasing the electrical characteristics of the semiconductor device. Furthermore, the above-mentioned plate-like conductive member is exposed outside the sealed body, thereby making it possible to increase the heat dissipation capability of the semiconductor device.

What is claimed is:

[1. A semiconductor device comprising a first transistor and a second transistor, each of which has an input electrode, first output electrode and second output electrode, wherein the current path connecting between said first output electrode and said second output electrode of said first transistor are connected in series to the current path connecting between said first output electrode and said second output electrode of said second transistor;

either said first output electrode or said second output electrode of said first transistor is connected to a first conductive member; and the other output electrode of said first transistor is connected to a second conductive member;

either said first output electrode or said second output electrode of said second transistor is connected to said second conductive member;

the other output electrode of said second transistor is connected to a third conductive member;

said first conductive member, said second conductive member and said third conductive member are electrically isolated from one another; and said first conductive member, said second conductive member, said third conductive member, said first transistor and said second transistor are mechanically integrated.]

[2. A semiconductor device according to claim 1, wherein said second conductive member has two or more bends.]

[3. A semiconductor device according to claim 1, wherein said second conductive member is a nearly S-shape.]

[4. A semiconductor device according to claim 1, wherein in said second conductive member, the surface to which an output electrode of said first transistor is connected is located on the same side of the surface to which an output electrode of said second transistor is connected.]

[5. A semiconductor device comprising a plurality of semiconductor chips, each of which has a terminal on its principal surface, a conductive plate which has electrical connections to at least two semiconductor chips' terminals among said plurality of semiconductor chips, a sealed body which encapsulates said plurality of semiconductor chips, and a plurality of external connection terminals which have individual electrical connections to the plurality of semiconductor chips, wherein at least two semiconductor chips which are connected by the conductive plate have an individual transistor circuit, and the conductive plate is exposed outside said sealed body.]

[6. A semiconductor device according to claim 5, wherein among said plurality of semiconductor chips, each of a first semiconductor chip and a second semiconductor chip has a power-supply transistor circuit; and said semiconductor device further comprising a first conductive plate which connects to a drain terminal of said first semiconductor chip, a second conductive plate which connects to a source terminal of said first semiconductor chip, a third conductive plate which connects to a drain terminal of said second semiconductor chip, and a fourth conductive plate which connects to a source terminal of said second semiconductor chip, wherein said second conductive plate has an electrical connection to said third conductive plate, and said second and third conductive plates are at least partially exposed outside said sealed body.]

[7. A semiconductor device according to claim 6, wherein said second conductive plate and said third conductor plate are integrated.]

[8. A semiconductor device according to claim 5, wherein among said plurality of semiconductor chips, each of a first semiconductor chip and a second semiconductor chip has a power-supply transistor circuit, and a third semiconductor chip has a driver circuit which controls said first and second semiconductor chips.]

[9. A semiconductor device according to claim 6, wherein said second and fourth conductive plates are partially exposed on either the principal or rear surface of said sealed body, and said first and third conductive plates are partially exposed on the other surface of said sealed body.]

[10. A semiconductor device according to claim 9, wherein said second conductive plate and said third conductor plate are integrated.]

[11. A semiconductor device according to claim 5, wherein among said plurality of semiconductor chips, at least one semiconductor chip is installed upside down in relation to the other semiconductor chips.]

[12. A semiconductor device according to claim 6, wherein said second semiconductor chip is installed upside down in relation to said first semiconductor chip, said second and third conductive plates are partially exposed on either the principal or rear surface of said sealed body; and said first and fourth conductive plates are partially exposed on the other surface of said sealed body.]

[13. A semiconductor device according to claim 12, wherein said second conductive plate and said third conductive plate are integrated.]

[14. A semiconductor device according to claim 5, wherein a heat radiating member is installed in the exposed area of said conductive plate exposed outside said sealed body.]

[15. A semiconductor device comprising a plurality of semiconductor chips, each of which has a terminal on its principal surface, a conductive plate which has electrical connections to at least two semiconductor chips' terminals among said plurality of semiconductor chips, a sealed body which encapsulates said plurality of semiconductor chips by resin, a plurality of external connection terminals which have individual electrical connections to the plurality of semiconductor chips, wherein said conductive plate is exposed outside said sealed body, and the connecting portion of said conductive plate at which said conductive plate is connected to one semiconductor chip is joined to the connecting portion at which said conductive plate is connected to the other semiconductor chip, on either the principal or rear surface of said sealed body, or on the outside of said semiconductor chips inside said sealed body.]

[16. A semiconductor device according to claim 15, wherein among said plurality of semiconductor chips, each of a first semiconductor chip and a second semiconductor chip has a power-supply transistor circuit, and a third semiconductor chip has a driver circuit which controls said first and second semiconductor chips.]

[17. A semiconductor device according to claim 15, wherein a heat radiating member is installed in the exposed area of said conductive plate exposed outside said sealed body.]

[18. A semiconductor device according to claim 15, wherein said conductive plate has an electrical connection to the semiconductor chip via a plurality of gold bumps.]

[19. A semiconductor device according to claim 16, wherein the terminal of said first semiconductor chip has an electrical connection to the terminal of said third semiconductor chip by said conductive plate, and the terminal of said second semiconductor chip has an electrical connection to the terminal of said third semiconductor chip by another conductive plate.]

[20. A semiconductor device comprising a plurality of semiconductor chips, each of which has a terminal on its principal surface, a conductive plate which has electrical connections to at least two semiconductor chips' terminals among said plurality of semiconductor chips, a sealed body which encapsulates said plurality of semiconductor chips by resin, a plurality of external connection terminals which have individual electrical connections to said plurality of semiconductor chips and are disposed on the peripheral edge of the rear surface of said sealed body, wherein said conductive plate is exposed on the at least either principal or rear surface of said sealed body.]

[21. A semiconductor device according to claim 20, wherein among said plurality of semiconductor chips, each of a first semiconductor chip and a second semiconductor chip has a power-supply transistor circuit, and a third semiconductor chip has a driver circuit which controls said first and second semiconductor chips.]

[22. A semiconductor device according to claim 20, wherein a heat radiating member is installed in the exposed area of said conductive plate exposed outside said sealed body.]

[23. A semiconductor device according to claim 20, wherein said conductive plate has an electrical connection to the semiconductor chip via a plurality of gold bumps.]

[24. A semiconductor device according to claim 20, wherein among said plurality of semiconductor chips, each of a first semiconductor chip and a second semiconductor chip has a power-supply transistor circuit, and said second semiconductor chip is installed upside down compared to said first semiconductor chip; and said semiconductor device further comprising a first conductive plate which connects to a drain terminal of said first semiconductor chip, a second conductive plate which connects to a source terminal of said first semiconductor chip, a third conductive plate which connects to a drain terminal of said second semiconductor chip, and a fourth conductive plate which connects to a source terminal of said second semiconductor chip, wherein said second and third conductive plates are partially exposed on either the principal or rear surface of said sealed body, and said first and fourth conductive plates are partially exposed on the other surface of said sealed to body.]

*25. A semiconductor device for a DC/DC converter formed in a single package comprising:*

*a first semiconductor chip having a main face and a rear face and electrically connected to a first conductor member at an input side;*

*a second semiconductor chip having a main face and a rear face and electrically connected to a second conductor member at a grounding side, wherein the first and second semiconductor chips are arranged in opposite relation to one another with respect to the main faces and the rear faces thereof;*

*a driver IC chip for controlling the first and second semiconductor chips;*

*a source terminal formed in the main face of the first semiconductor chip;*

*a drain terminal formed in the rear face of the first semiconductor chip;*

*a drain terminal formed in the main face of the second semiconductor chip;*

*a source terminal and gate terminal formed in the rear face of the second semiconductor chip;*

*a source terminal and gate terminal formed in a rear face of the second semiconductor chip; and*

*a single conductor member formed above the source terminal of the first semiconductor chip and the drain terminal of the second semiconductor chip;*

*wherein the single conductor member is electrically connected to the source terminal of the first semiconductor chip and the drain terminal of the second semiconductor chip, and*

*wherein the gate terminal of the second semiconductor chip is electrically connected to the driver IC chip.*

*26. The semiconductor device for a DC/DC converter according to claim 25, wherein the first semiconductor chip and the second semiconductor chip are power transistors.*

*27. A semiconductor device for a DC/DC converter formed in a single package comprising:*

*a first external terminal;*

*a second external terminal;*

*a third external terminal;*

*a first semiconductor chip, having a main face and a rear face and formed above the first external terminal, electrically connected to a first conductor member at an input side;*

*a second semiconductor chip, having a main face and a rear face and formed above the second external terminal, electrically connected to a second conductor member at a grounding side;*

*a driver IC chip for controlling the first and second semiconductor chips;*

*a source terminal formed in the main face of the first semiconductor chip;*

*a drain terminal formed in the rear face of the first semiconductor chip, wherein the first and second semiconductor chips are arranged in opposite relation with respect to the main and rear faces thereof;*

*a drain terminal formed in the main face of the second semiconductor chip;*

*a source terminal and a gate terminal formed in the rear face of the second semiconductor chip; and*

*a single conductor member formed above the source terminal of the first semiconductor chip, the drain terminal of the second semiconductor chip and the third external terminal; wherein the single conductor member is electrically connected to the source terminal of the first semiconductor chip, the drain terminal of the second semiconductor chip and the third external terminal,*

*wherein a terminal is formed in a main face of the driver IC chip,*

*wherein a wire is connected to the terminal of the driver IC chip and the gate terminal of the second semiconductor chip,*

*wherein the first, second and third external terminals are formed in a rear face of the package, and*

*wherein the first external terminal is electrically connected to the drain terminal of the first semiconductor chip.*

*28. The semiconductor device for a DC/DC converter according to claim 27, wherein a gate terminal is formed in the main face of the first semiconductor,*

*wherein a second terminal different from the terminal formed in the main face of the driver IC chip is formed in the main face of the driver IC chip, and*

*wherein a wire is connected to the second terminal of the driver IC chip.*

*29. The semiconductor device for a DC/DC converter according to claim 27, wherein a cross sectional area of the conductor plate member is larger than that of the wire.*

*30. The semiconductor device for a DC/DC converter according to claim 29, wherein the first and second semiconductor chips are power transistors.*

*31. A semiconductor device for a DC/DC converter formed in a single package comprising:*

*a plate conductor member at an input side;*

*a plate conductor member at a grounding side;*

*a plate conductor member at an output;*

*a first semiconductor chip having a main face and a rear face and formed above the first external terminal and electrically connected to a plate conductor member at an input side;*

*a second semiconductor chip having a main face and a rear face and formed above the second external terminal and electrically connected to a plate conductor member at a grounding side, wherein the first and second semiconductor chips are arranged in opposite relation with respect to the main and rear faces thereof;*

*a source terminal and a gate terminal formed in the main face of the first semiconductor chip;*

*a drain terminal formed in the rear face of the first semiconductor chip;*

*a drain terminal formed in the main face of the second semiconductor chip;*

*a source terminal formed in the rear face of the second semiconductor chip; and*

*a single conductor member formed above the plate conductor member at the output side, the source terminal of the first semiconductor chip and the drain terminal of the second semiconductor chip and the third external terminal*

*wherein the single conductor member is electrically connected to the source terminal of the first semiconductor chip, the drain terminal of the second semiconductor chip and the plate conductor member at the output side,*

*a wire electrically connected to the source terminal of the second semiconductor chip;*

*wherein the plate conductor members at the input side, grounding side and output side are formed in the rear face of the package,*

*wherein the plate conductor member at the input side is electrically connected to the drain terminal of the first semiconductor chip, and*

*wherein the plate conductor member at the grounding side is electrically connected to the source terminal of the second semiconductor chip.*

*32. The semiconductor device for a DC/DC converter according to claim 31, wherein cross sectional areas of the conductor plate members are each respectively larger than that of the wire.*

*33. The semiconductor device for a DC/DC converter according to claim 31, which further comprises a driver IC chip for controlling the first and second semiconductor chips,*

*wherein the source terminal of the first semiconductor chip is electrically connected to the driver IC chip.*

*34. The semiconductor device for a DC/DC converter according to claim 31, wherein the source terminal of the first semiconductor chip is electrically connected to an area where the conductor plate member at the output side is not connected, and wherein the wire is connected to the area.*

*35. A semiconductor device for a DC/DC converter formed in a single package comprising:*

*a plate conductor member at an input side;*

*a plate conductor member at a grounding side;*

*a plate conductor member at an output side;*

*a first semiconductor chip having a main face and a rear face and formed above the conductor member at input side;*

*a second semiconductor chip having a main face and a rear face and above the plate conductor member at the grounding side, wherein the first and second semiconductor chips are arranged in opposite relation with respect to the main and rear faces thereof;*

*a source terminal and a gate terminal formed on the main surface of the first semiconductor chip,*

*a drain terminal formed on the rear face of the first semiconductor chip;*

*a drain terminal formed on the main face of the second semiconductor chip;*

*a source terminal formed on the rear face of the second semiconductor chip;*

*a single conductor member above the plate conductor member at the output side, wherein the single conductor member is electrically connected to the source terminal of the first semiconductor chip, the drain terminal of the second semiconductor chip, and the plate conductor member at the output side; and*

*a wire connected to the source terminal of the first semiconductor chip;*

*wherein the plate conductor member at the input side, the plate conductor member at the grounding side and the plate conductor member at the output side are formed in a rear face of the package,*

*wherein the plate conductor member at the input side is electrically connected to the drain terminal of the first semiconductor chip, and*

*wherein the plate conductor member at the grounding side is electrically connected to the source terminal of the second semiconductor chip.*

*36. The semiconductor device for a DC/DC converter according to claim 35, which further comprises a driver IC chip for controlling the first and second semiconductor chips, wherein the gate terminal of the first semiconductor is electrically connected to the driver IC chip, and*

*wherein a wire is electrically connected to the driver IC chip.*

*37. The semiconductor device for a DC/DC converter according to claim 35, which further comprises a driver IC chip for controlling the first and second semiconductor chips, wherein a gate terminal of the second semiconductor chip is formed in the rear face of the second semiconductor chip, and*

*wherein the gate terminal of the second semiconductor chip is electrically connected to the driver IC chip.*

*38. The semiconductor device according to claim 35, wherein the first semiconductor chip and the second semiconductor chip are power transistors.*

*39. A semiconductor device for a DC/DC converter formed in a single package comprising:*

*a first semiconductor chip having a main face and a rear face and electrically connected to a plate conductor member;*

*a second semiconductor chip having a main face and a rear face and electrically connected to a plate conductor member at a grounding side;*

*a source terminal and a gate terminal formed on the main surface of the first semiconductor chip,*

*a drain terminal formed in the rear face of the first semiconductor chip;*

*a drain terminal formed in the main face of the second semiconductor chip;*

*a source terminal formed in the rear face of the second semiconductor chip; and*

*a single conductor member above the source terminal of the first semiconductor chip and the drain terminal of the second semiconductor chip,*

*wherein the single conductor member is electrically connected to the source terminal of the first semiconductor chip and the drain terminal of the second semiconductor chip, and*

*wherein a wire is connected to the source terminal and the gate terminal of the first semiconductor chip.*

*40. A semiconductor device for a DC/DC converter formed in a single package comprising:*

*a first semiconductor chip having a main face and a rear face and electrically connected to a plate conductor member;*

*a second semiconductor chip having a main face and a rear face and electrically connected to a plate conductor member at a grounding side;*

*a driver IC chip for controlling the first and second semiconductor chips;*

*a source terminal and a gate terminal formed on the main surface of the first semiconductor chip,*

*a drain terminal formed on the rear face of the first semiconductor chip;*

*a drain terminal formed in the main face of the second semiconductor chip;*

*a source terminal formed in the rear face of the second semiconductor chip; and*

*a single conductor member above the source terminal of the first semiconductor chip and the drain terminal of the second semiconductor chip,*

*wherein the single conductor member is electronically connected to the source terminal of the second semiconductor chip, and*

*wherein a wire is connected to the source terminal of the first semiconductor chip and the driver IC chip.*

*41. The semiconductor device for a DC/DC converter according to claim 40, wherein the wire is connected to a source terminal area where the single conductor member is not connected to the first semiconductor chip.*

*42. A semiconductor device for a DC/DC converter comprising:*

*a first semiconductor chip having a main face and a rear face and electrically connected to a plate conductor member at an input side;*

*a second semiconductor chip having a main face and a rear face and connected to a plate conductor member at a grounding side, wherein the first and second semiconductor chips are arranged in opposite relation with respect to the main and rear faces thereof;*

*a driver IC chip for controlling the first and second semiconductor chips;*

*a source terminal formed in the main face of the first semiconductor chip;*

*a drain terminal formed in the rear face of the first semiconductor chip;*

*a drain terminal formed in the main face of the second semiconductor chip;*

*a source terminal formed in the rear face of the second semiconductor chip; and*

*a single conductor member formed above the source terminal of the first semiconductor chip and drain terminal of the second semiconductor chip, wherein the single conductor member is electrically connected to the source terminal and the gate terminal of the first semiconductor chip, and*

*wherein the driver IC chip is provided with a terminal to connect with the source terminal of the first semiconductor chip.*

*43. The semiconductor device according to claim 42, wherein the wire is electrically connected to the terminal of the driver IC chip in an area of the source terminal where the first semiconductor chip is not connected to the single conductor member.*

*44. The semiconductor device for a DC/DC converter according to claim 42, wherein a gate terminal is formed in the main face of the first semiconductor chip, and a wire for electrically connecting the driver IC chip is connected to the gate terminal.*

*45. The semiconductor device for a DC/DC converter according to claim 42, wherein a gate terminal is formed in the rear face of the second semiconductor chip, and the gate terminal of the second semiconductor chip is electrically connected to the terminal of the driver IC chip.*

*46. The semiconductor device for a DC/DC converter according to claim 42, wherein a sectional area of the plate conductor member at the output side is larger than that of the wire.*

*47. The semiconductor device according to claim 25, wherein the first and second conductor members are plate conductor members.*

*48. The semiconductor device according to claim 27, wherein the first and second conductor members are plate conductor members.*

* * * * *